United States Patent
Bang

(10) Patent No.: US 7,851,874 B2
(45) Date of Patent: Dec. 14, 2010

(54) SEMICONDUCTOR DEVICE AND METHOD FOR MANUFACTURING THE SAME

(75) Inventor: Ki Wan Bang, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 531 days.

(21) Appl. No.: 11/847,930

(22) Filed: Aug. 30, 2007

(65) Prior Publication Data

US 2008/0054380 A1 Mar. 6, 2008

(30) Foreign Application Priority Data

Aug. 30, 2006 (KR) ........................ 10-2006-0083087

(51) Int. Cl.
*H01L 29/94* (2006.01)
*H01L 21/336* (2006.01)
(52) U.S. Cl. ...................................... 257/412
(58) Field of Classification Search ................
257/E21.09–E21.134, E21.461–E21.465,
257/412, 118, 224, 328, 333, 466, 594, 327,
257/349, 335, 336, 491, 492, 13, 15, 11;
438/242, 268–274, 221, 296, 353, 40, 254,
438/494, 498, 634, 669–673, 924, 940, 689–757
See application file for complete search history.

(56) References Cited

U.S. PATENT DOCUMENTS

| | | | | |
|---|---|---|---|---|
| 7,074,683 | B2 * | 7/2006 | Hwang et al. | 438/300 |
| 2003/0113973 | A1 * | 6/2003 | Chu | 438/296 |
| 2005/0127468 | A1 * | 6/2005 | Ito | 257/501 |
| 2006/0148164 | A1 * | 7/2006 | Park | 438/216 |
| 2007/0187727 | A1 * | 8/2007 | Ting et al. | 257/274 |

FOREIGN PATENT DOCUMENTS

| | | |
|---|---|---|
| KR | 10-1996-0029326 | 4/1998 |
| KR | 10-1996-0075441 | 9/1998 |
| KR | 10-2002-0040699 | 1/2004 |

* cited by examiner

*Primary Examiner*—Dao H Nguyen
*Assistant Examiner*—Tram H Nguyen
(74) *Attorney, Agent, or Firm*—Saliwanchik, Lloyd & Saliwanchik

(57) ABSTRACT

A semiconductor device according to an embodiment includes device isolating layers having a top surface lower than a sheet height of a semiconductor substrate; a gate insulating layer and a gate electrode sequentially stacked on the upper surface of an active region of the semiconductor substrate between the device isolating layers; a spacer formed at the side wall of the gate electrode; a source/drain region formed in the semiconductor substrate between the spacer and the device isolating layers; and a silicide film formed on the source/drain region.

5 Claims, 6 Drawing Sheets

SEMICONDUCTOR DEVICE AND METHOD FOR MANUFACTURING THE SAME

CROSS-REFERENCE TO RELATED APPLICATION

The present application claims the benefit under 35 U.S.C. §119 of Korean Patent Application No. 10-2006-0083087, filed Aug. 30, 2006, which is hereby incorporated by reference in its entirety.

BACKGROUND

As the integration of a semiconductor device has become high, the width of a source/drain region and a gate electrode of a MOS transistor has been reduced. Therefore, the sheet resistance of the source/drain region and the gate electrode has become high, causing the operation of the device to become deteriorated.

Accordingly, a metal silicide film of low resistance materials is formed on the gate and the region implanted with an impurity, such as the source/drain region, in a semiconductor manufacturing process to lower the sheet resistance. Such silicide materials mainly use rare earth metals that react to silicon. For example, common silicides include tungsten silicide ($WSi_2$), titanium suicide ($TiSi_2$), and cobalt silicide ($CoSi_2$).

BRIEF SUMMARY

Embodiments of the present invention provide a semiconductor device and a method manufacturing the same that increases the area of a silicide film of a source/drain region by etching a device isolating layer at a predetermined depth so that the area of an active region of a substrate is increased by means of the etched device isolating layer edge.

A semiconductor device according to an embodiment includes: a device isolating layer formed lower than a sheet height of a semiconductor substrate; a gate insulating layer and a gate electrode sequentially stacked on the upper surface of an active region of the semiconductor substrate between device isolating layers; a spacer formed at the side wall of the gate electrode; a source/drain region formed in the semiconductor substrate between the spacer and the device isolating layers; and a silicide film formed on the source/drain region.

A method for manufacturing a semiconductor device according to an embodiment includes: forming a device isolating layer on a semiconductor substrate; sequentially stacking a gate insulating layer and a gate electrode on the upper surface of an active area of the semiconductor substrate; etching the device isolating layer lower than a sheet height of the semiconductor substrate; forming a spacer at the side wall of the gate electrode; forming a source/drain region in the semiconductor substrate between the spacer and the device isolating layer; and forming a silicide film in the source/drain region.

DETAILED DESCRIPTION

Hereinafter, certain embodiments of the present invention will be described in detail with reference to the accompanying drawings.

Figure 1:
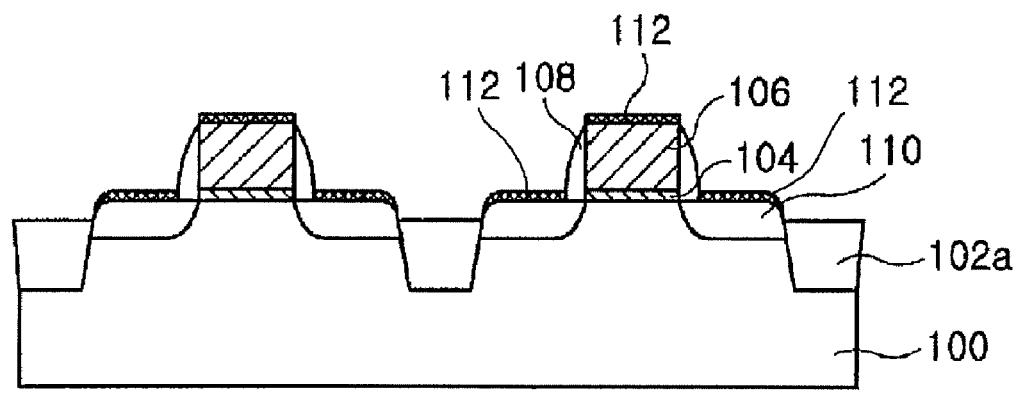
FIG. 1 is a cross-sectional view showing a semiconductor device having a silicide film according to an embodiment of the present invention.

FIG. 1 is a cross-sectional view showing a semiconductor device having a silicide film according to embodiment of the present invention.

As shown in FIG. 1, a semiconductor device can include a device isolating layer 102a etched by a predetermined depth from a top surface of a semiconductor substrate 100. The semiconductor substrate 100 can be, for example, a silicon substrate. The device isolating layer 102a can define an active region and a non-active region of the substrate. A gate electrode 106 can be formed on the active region of the semiconductor substrate 100 with a gate insulating layer 104 interposed therebetween. A spacer 108 can be formed at the side wall of the gate electrode 106, and a source/drain region 110 can be formed in the substrate 100 at both sides of the spacer 108. In addition, silicide films 112 can be formed on the gate electrode 106 and the upper surface of the source/drain region 110.

According to embodiments, the source/drain region 110 can include a LDD structure where a low-concentration of impurity dopant is implanted into the substrate 100 to the edges of the gate electrode 106.

Referring again to FIG. 1, in the MOS transistor having the silicide film according to an embodiment of the present invention, the area of the active region of the semiconductor substrate 100 is increased by means of the edge region of the device isolating layer 102a etched by a predetermined depth from the top surface of the semiconductor substrate 100. In addition, the silicide film 112 is formed in the source/drain region, which can include the increased active region of the semiconductor substrate 100 so that the area of the silicide of the source/drain region can be increased, making it possible to lower the contact resistance of the corresponding region.

FIGS. 2a to 2e are cross-sectional views for explaining a method for manufacturing a semiconductor device according to an embodiment of the present invention.

Figure 2A:
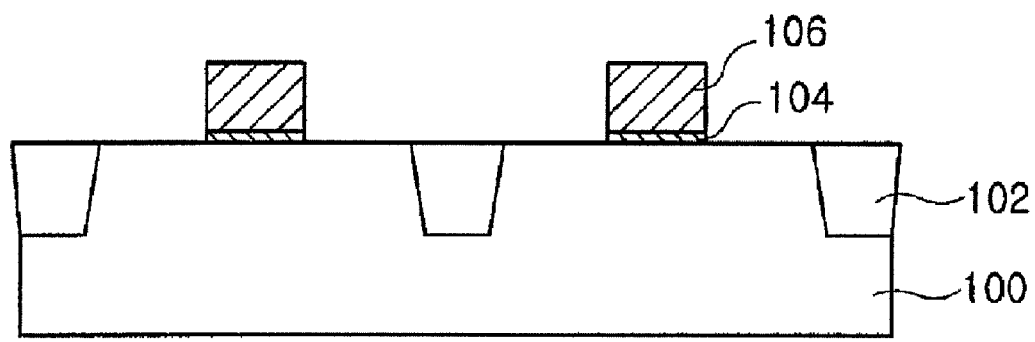
FIGS. 2a to 2e are cross-sectional views showing a method for manufacturing a semiconductor device having a silicide film according to an embodiment of the present invention.

Referring to FIG. 2a, a device isolating layer 102 defining an active region and a non-active region on a semiconductor substrate 110 can be formed. For example, in one embodiment, the semiconductor substrate 100 can be etched by a predetermined depth to form a trench, and then insulating materials can be formed to fill the trench. The insulating materials can include an oxide film formed by HDP (high density plasma) deposition and then planarized within the trench by a chemical mechanical polishing (CMP) process to form the device isolating layer 102.

An insulating layer, for example, a silicon oxide film ($SiO_2$), can be formed on the semiconductor substrate 100 having the device isolating layer 102. The insulating layer can be formed to a thickness of, for example, about 100 Å. A gate conductive layer can be formed on the insulating layer. In one embodiment, the gate conductive layer can be deposited to a thickness of, for example, about 3000 Å. The gate conductive layer can be formed of, for example, silicon-germanium (SiGe), cobalt (Co), tungsten (W), titanium (Ti), nickel (Ni), tantalum (Ta), a titanium nitride film (TiN), a tantalum nitride film (TaN), a tungsten nitride film (WN), a polysilicon doped with an impurity, or a composite thereof.

A photoresist pattern (not shown) defining a gate region can be formed on the gate conductive layer by performing a photo process, and a gate electrode 106 can be formed by etching the gate conducting layer using the photoresist pattern as an etch mask. The etching can be accomplished by dry-etching, such as, for example, performing a reactive ion etching (RIE) process. In addition, a gate insulating layer 104 can be forme d by dry-etching the insulating layer. Then, the photoresist pattern can be removed by, for example, an ashing process.

Figure 2B:
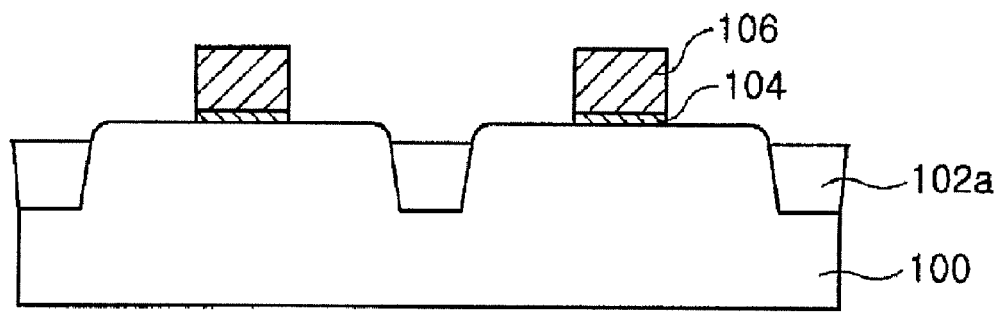

Referring to FIG. 2b, the device isolating layer 102 can then be etched at a predetermined depth by performing a wet-etching process such that the surface of the device isolation layer is lower than the top surface of the semiconductor substrate 100, also referred to here as the sheet height. By means of such a device isolating layer 102a etched lower than the sheet height of the semiconductor substrate 100, the area of the active region is increased by including the edge region of the device isolating layer.

Although not shown in the drawing, a LDD region can be formed in the substrate between the gate electrode 106 and the device isolating layer 102 by performing an ion implantation process (for example, an ion-implantation of an N type dopant at low-concentration) using the gate electrode 106 as an ion implantation mask.

Figure 2C:
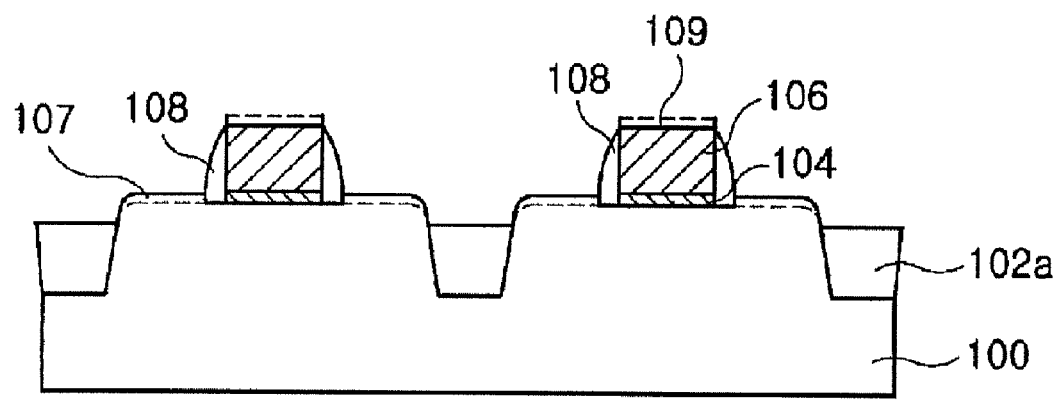

Referring to FIG. 2c, a spacer 108 can be formed at the side wall of the gate electrode 106 by depositing insulating materials, for example, a silicon nitride film (SiN) or a silicon oxynitride film (SiON), on the semiconductor substrate 100 and performing an etch back process. The etch back process can be a dry-etching, such as, a reactive ion etching (RIE).

A silicon epitaxial growth process can be performed to epitaxially grow the silicon of the gate electrode 106 and to epitaxially grow the silicon of the substrate active region exposed between the spacer 108 and the device isolating layer 102, thereby forming epitaxial growing layers 107 and 109. The area of the active region of the substrate can be further increased by means of such a silicon epitaxial growth process.

Figure 2D:
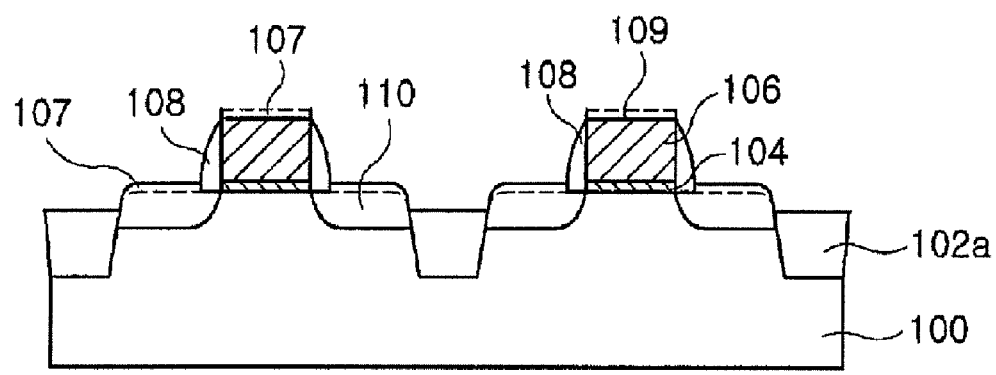

Thereafter, referring to FIG. 2d, a source/drain region 110 including the LDD region, can be formed by performing a high-concentration ion implantation process (for example, the ion-implantation of N type dopant at high-concentration) using the spacer 108 and the gate electrode 106 as an ion implantation mask.

Figure 2E:
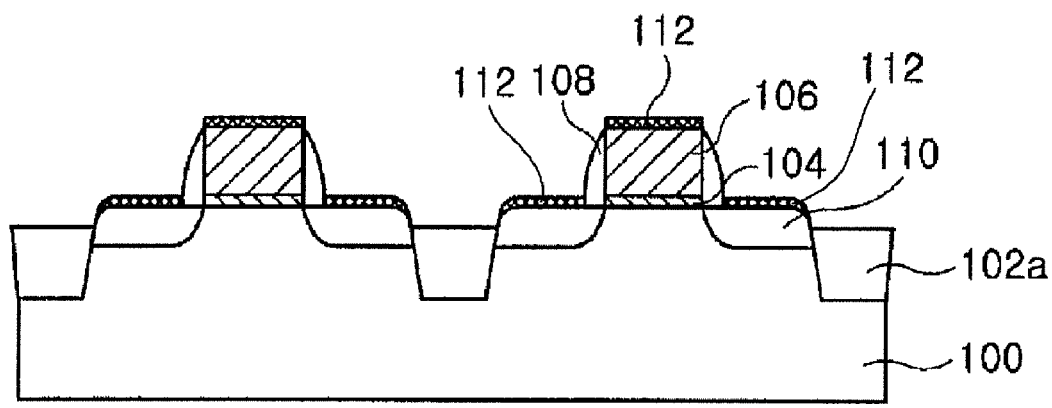

Then, referring to FIG. 2e, a silicide film 112 can be formed on the gate electrode 106 and the upper surface of the source/drain region 110 by depositing silicide metal materials, such as, for example, titanium (Ti), on the substrate 100 and performing an annealing process thereon.

In certain embodiments, the silicide metal materials can be formed of any one of rare earth metals such as cobalt (Co), titanium (Ti), nickel (Ni), tungsten (W), platinum (Pt), hafnium (Hf), palladium (Pd), or the alloy thereof. Accordingly, the silicide film 112 may be, for example, tungsten silicide ($WSi_2$), titanium silicide ($TiSi_2$), or cobalt silicide (CoSi).

The metal materials not silicided during the annealing process can be removed by means of a cleaning process.

According to embodiments of the present invention, the device isolating layer 102 is etched by a predetermined depth to be lower than the sheet height of the semiconductor substrate 100, and the active region of the semiconductor substrate 100 is epitaxially grown to increase the area of the active region of the substrate. Thereafter, silicide film 112 is formed on the source/drain region 110, which includes the increased active region of the semiconductor substrate 100, thereby increasing the silicide area of the source/drain region 110 and making it possible to lower the contact resistance of the corresponding source/drain region.

FIGS. 3a to 3f cross-sectional views for explaining a method for manufacturing a semiconductor device having a silicide film according to another embodiment.

Figure 3A:
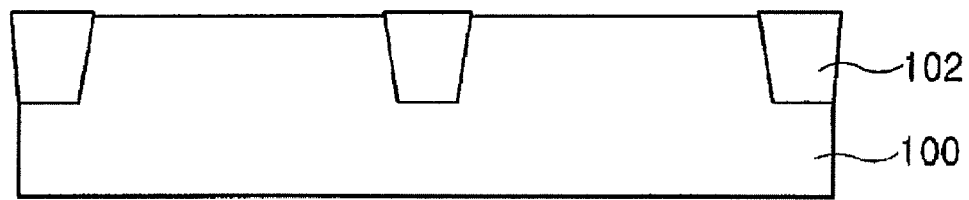
FIGS. 3a to 3f are cross-sectional views showing a method for manufacturing a semiconductor device having a silicide film according to another embodiment of the present invention.

Referring to FIG. 3a, a device isolating layer 102 defining an active region and a non-active region on a semiconductor substrate 110 can be formed. For example, in one embodiment, the substrate 100 can be etched by a predetermined depth to form a trench, and then insulating materials can be formed to fill the trench. The insulating materials can include an HDP deposited oxide film that is a planarized within the trench by a chemical mechanical polishing (CMP) process to form the device isolating layer 102.

Figure 3B:
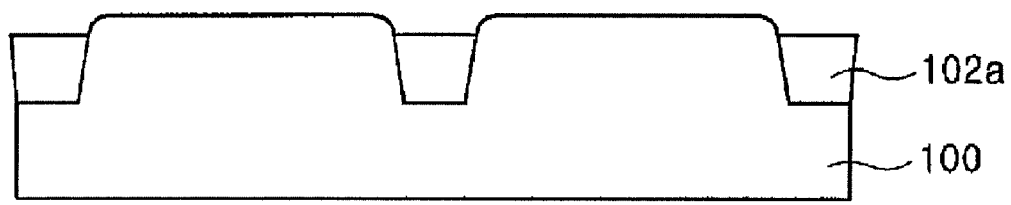

Referring to FIG. 3b, the device isolating layer 102 can then be etched by a predetermined depth by performing a wet-etching process such that the top surface of the device isolation layer 102a is lower than the sheet height of the substrate 100. The area of the active region can be increased by means of such a device isolating layer 102a etched lower than the sheet height of the substrate 100, because the area of the active region includes the vicinity of the edge of the device isolating layer.

Figure 3C:
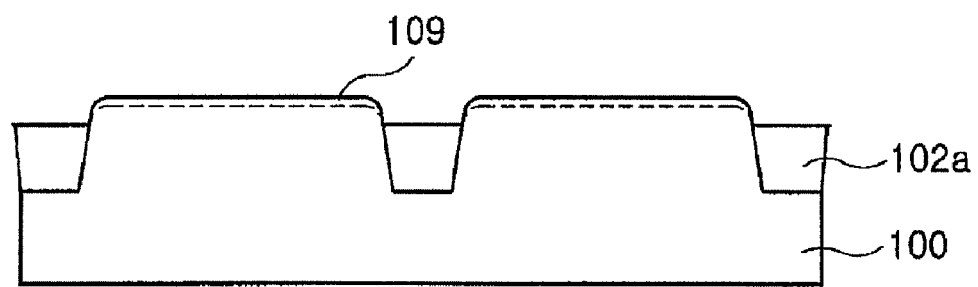

Then, referring to FIG. 3c, a silicon epitaxial growth process can be performed to epitaxially grow the silicon of the substrate active region exposed by means of the etched device isolating layer 102a, to form an epitaxial growing layer 109. Because of such a silicon epitaxial growth process, the area of the active region of the substrate is further increased.

Figure 3D:
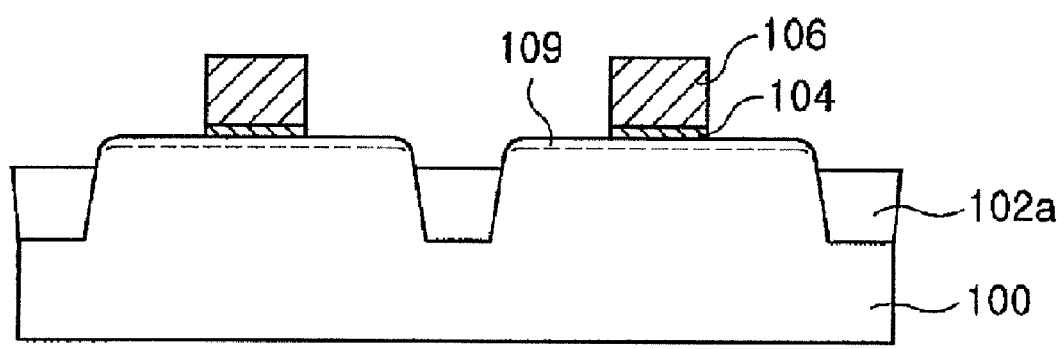

Referring to FIG. 3d, an insulating layer, for example, a silicon oxide film ($SiO_2$), can be formed on the semiconductor substrate 100 having the epitaxial growing layer 109, and a gate conductive layer can be deposited thereon. In one embodiment, the gate oxide layer can be formed to about 100 Å and the gate conductive layer can be formed to about 3000 Å. The gate conductive layer can be formed of, for example, silicon-germanium (SiGe), cobalt (Co), tungsten (W), titanium (Ti), nickel (Ni), tantalum (Ta), a titanium nitride film (TiN), a tantalum nitride film (TaN), a tungsten nitride film (WN) a composite thereof, or polysilicon doped with an impurity.

A photoresist pattern (not shown) defining a gate region can be formed on the gate conductive layer by performing a photo process. A gate electrode 106 can be formed by etching the gate conductive layer using the photoresist pattern as an etch mask. The etching can be performed by dry-etching, for example, reactive ion etching (RIE), the gate conductive layer exposed by the photoresist pattern. In addition, a gate insulating layer 104 can be formed by dry-etching the insulating layer. Then, the photoresist pattern can be removed by, for example, an ashing process.

Although not shown in the drawing, a LDD region can be formed in the substrate 100 having the epitaxial growth layer 109 between the gate electrode 106 and the device isolating layer 102a by performing an ion implantation process (for example, the ion-implantation of an N type dopant of low-concentration) using the gate electrode 106 as an ion implantation mask.

Figure 3E:
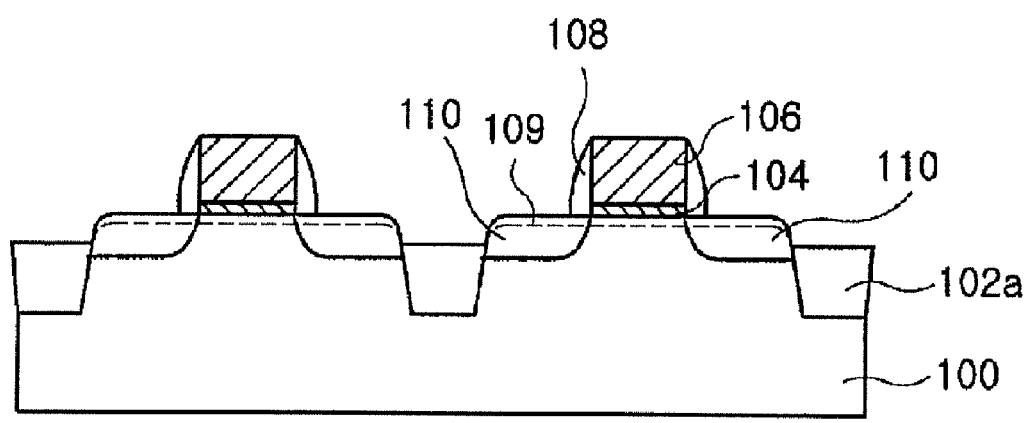

Referring to FIG. 3e, a spacer 108 can be formed at the side wall of the gate electrode 106 by depositing insulating materials, such as for example, a silicon nitride film (SiN) or a silicon oxynitride film (SiON), on the substrate 100 and performing an etch back process such as reactive ion etching (RIE).

Thereafter, a source/drain region 110 (with the LDD region therein) can be formed in the substrate 100 between the gate electrode 106 and the device isolating layer 102a by performing a high-concentration ion implantation process (for example, the ion implantation of N type dopant of high-concentration) using the spacer 108 and the gate electrode 106 as an ion implantation mask.

Figure 3F:
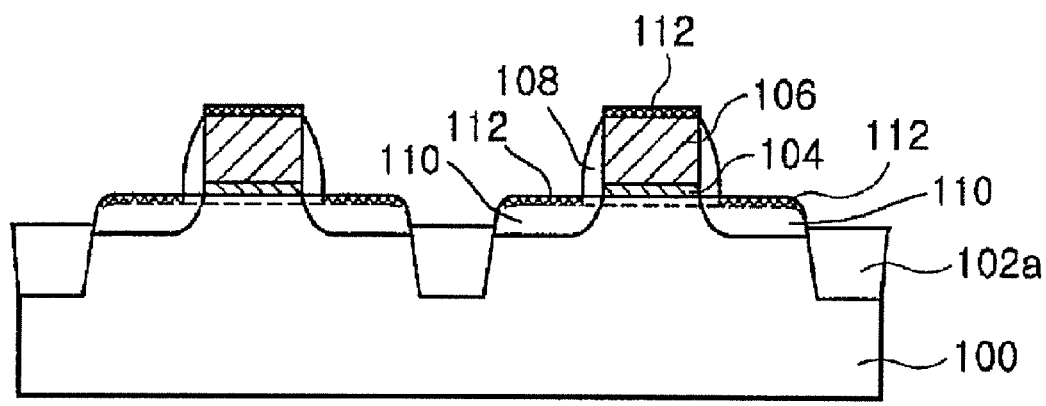

Referring to FIG. 3F, a silicide film 112 can be formed on the gate electrode 106 and the upper surface of the source/drain region 110 by depositing silicide metal materials, such as, for example, titanium (Ti), on the semiconductor substrate 100 and performing an annealing process thereon. In certain embodiments, the silicide metal materials can be formed of any one of rare earth metals such as cobalt (Co), titanium (Ti), nickel (Ni), tungsten (W), platinum (Pt), hafnium (Hf), palladium (Pd) or the alloy thereof. Accordingly, the silicide film 112 may be, for example, tungsten silicide ($WSi_2$), titanium silicide ($TiSi_2$), or cobalt silicide (CoSi).

Thereafter, the metal materials not silicided during the annealing process can be removed by means of a cleaning process.

According to embodiments of the present invention, the device isolating layer 102 is etched by a predetermined depth to be lower than the sheet height of the substrate 100 before forming the gate electrode 106, and the active region of the substrate 100 is epitaxially grown to increase the area of the active region of the substrate. Silicide film 112 is formed on the source drain/region, which includes the increased active region of the substrate 100, thereby increasing the silicide area of the source/drain region and making it possible to lower the contact resistance of the corresponding source/drain region.

As described above, the device isolating layer can be etched by a predetermined depth before or after forming the gate electrode so that the area of the active region thereof is increased by means of the edge of the etched device isolating layer, making it possible to increase the area of the silicide film formed in the source/drain region, which is the active region of the substrate.

Also, the silicon of the substrate can be epitaxially grown after etching the device isolating layer to further increase the area of the active region, making it possible to increase the area of the silicide film of the source/drain region.

Therefore, embodiments of the present invention can lower the contact resistance of the source/drain region, having an effect capable of improving the operation speed of the semiconductor device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device, comprising:
    forming a device isolating layer on a semiconductor substrate;
    forming a gate electrode on the upper surface of an active area of the semiconductor substrate;
    etching the device isolating layer to a height lower than a sheet height of the semiconductor substrate such that the topmost surface of the device isolating layer is below the sheet height of the semiconductor substrate;
    forming a spacer at the side wall of the gate electrode;
    forming a source/drain region between the spacer and the etched device isolating layer; and
    forming a silicide film on the source/drain region after etching the device isolating layer,
    wherein the silicide film is formed on both a top exposed surface and an exposed side surface of the source/drain region,
    wherein forming the gate electrode is performed before etching the device isolating layer.

2. The method according to claim 1, further comprising:
    forming an epitaxial growth layer on the substrate between the spacer and the etched device isolating layer, wherein the silicide film is formed on the epitaxial growth layer on the source/drain region.

3. The method according to claim 2, further comprising forming the epitaxial growth layer on the gate electrode during forming the epitaxial growth layer on the substrate between the spacer and the etched device isolating layer.

4. The method according to claim 1, further comprising forming a silicide film on the gate electrode.

5. The method according to claim 4, wherein the silicide film is simultaneously formed on the source/drain region and the gate electrode.

* * * * *